(12) United States Patent
Miano et al.

(10) Patent No.: US 12,500,563 B2
(45) Date of Patent: Dec. 16, 2025

(54) SUPERCONDUCTING TRAVELING-WAVE PARAMETRIC AMPLIFIER

(71) Applicant: SeeQC, Inc., Elmsford, NY (US)

(72) Inventors: Alessandro Miano, New Haven, CT (US); Oleg Mukhanov, Putnam Valley, NY (US)

(73) Assignee: SeeQC, Inc., Elmsford, NY (US)

( * ) Notice: Subject to any disclaimer, the term of this patent is extended or adjusted under 35 U.S.C. 154(b) by 0 days.

(21) Appl. No.: 18/629,168

(22) Filed: Apr. 8, 2024

(65) Prior Publication Data
US 2024/0267014 A1    Aug. 8, 2024

Related U.S. Application Data

(63) Continuation of application No. 17/246,535, filed on Apr. 30, 2021, now Pat. No. 11,955,934, which is a
(Continued)

(51) Int. Cl.
*H03F 19/00* (2006.01)
*H03F 7/02* (2006.01)
(Continued)

(52) U.S. Cl.
CPC ............... *H03F 19/00* (2013.01); *H03F 7/02* (2013.01); *H10N 60/12* (2023.02); *H10N 60/805* (2023.02)

(58) Field of Classification Search
CPC ........... H03F 19/00; H03F 7/02; G06N 10/00; H01L 39/025; H01L 39/223
(Continued)

(56) References Cited

U.S. PATENT DOCUMENTS

| 5,917,322 A | 6/1999 | Gershenfeld |
| 6,459,097 B1 | 10/2002 | Zagoskin |

(Continued)

FOREIGN PATENT DOCUMENTS

| CN | 105738838 A | 7/2016 |
| WO | WO2018052427 A1 | 3/2018 |

OTHER PUBLICATIONS

Nation, P. D., "Quantum analysis of a nonlinear microwave cavity-embedded dc SQUID displacement detector", Physical Review B 78, 104516, Sep. 2008, pp. 1-17 (Year: 2008).*
(Continued)

*Primary Examiner* — Hafizur Rahman
(74) *Attorney, Agent, or Firm* — Hoffberg & Associates; Steven M. Hoffberg

(57) ABSTRACT

A system and method are disclosed for a superconducting traveling-wave parametric amplifier (TWPA) with improved control and performance. In a preferred embodiment, the amplifier comprises an integrated array of symmetric rf-SQUIDs in a transmission line structure. A device was fabricated using niobium superconducting integrated circuits, and confirmed predicted performance, with a maximum gain up to 17 dB and a bandwidth of 4 GHz. A similar device can be applied as a low-noise, low-dissipation microwave amplifier for output from a superconducting quantum computer, or as a preamplifier, switch, or frequency converter for a sensitive microwave receiver, or as an output amplifier for a frequency-multiplexed superconducting detector array.

19 Claims, 10 Drawing Sheets

Related U.S. Application Data continuation of application No. 16/402,148, filed on May 2, 2019, now Pat. No. 10,998,869.

(51) Int. Cl.
  *H10N 60/12* (2023.01)
  *H10N 60/80* (2023.01)
(58) Field of Classification Search
  USPC .......................................................... 330/4.6
  See application file for complete search history.

(56) References Cited

U.S. PATENT DOCUMENTS

| | | | |
|---|---|---|---|
| 6,495,854 B1 | 12/2002 | Newns | |
| 6,504,172 B2 | 1/2003 | Zagoskin | |
| 6,573,202 B2 | 6/2003 | Ivanov | |
| 6,614,047 B2 | 9/2003 | Tzalenchuk | |
| 6,627,915 B1 | 9/2003 | Ustinov | |
| 6,649,929 B2 | 11/2003 | Newns | |
| 6,784,451 B2 | 8/2004 | Amin | |
| 6,803,599 B2 | 10/2004 | Amin | |
| 6,838,694 B2 | 1/2005 | Esteve | |
| 6,897,468 B2 | 5/2005 | Blais | |
| 6,900,454 B2 | 5/2005 | Blais | |
| 6,930,320 B2 | 8/2005 | Blais | |
| 6,960,780 B2 | 11/2005 | Blais | |
| 6,979,836 B2 | 12/2005 | Zagoskin | |
| 6,984,846 B2 | 1/2006 | Newns | |
| 7,002,174 B2 | 2/2006 | Evgeni | |
| 7,015,499 B1 | 3/2006 | Zagoskin | |
| 7,018,852 B2 | 3/2006 | Wu | |
| 7,135,701 B2 | 11/2006 | Amin | |
| 7,145,170 B2 | 12/2006 | Yamamoto | |
| 7,253,654 B2 | 8/2007 | Amin | |
| 7,253,701 B2 | 8/2007 | Smith | |
| 7,268,576 B2 | 9/2007 | Amin | |
| 7,335,909 B2 | 2/2008 | Amin | |
| 7,364,923 B2 | 4/2008 | Lidar | |
| 7,418,283 B2 | 8/2008 | Amin | |
| 7,479,652 B2 | 1/2009 | Greentree | |
| 7,498,832 B2 | 3/2009 | Baumgardner | |
| 7,605,600 B2 | 10/2009 | Harris | |
| 7,619,437 B2 | 11/2009 | Thom | |
| 7,639,035 B2 | 12/2009 | Berkley | |
| 7,687,938 B2 | 3/2010 | Bunyk | |
| 7,724,083 B2 | 5/2010 | Herring | |
| 7,800,395 B2 | 9/2010 | Johnson | |
| 7,843,209 B2 | 11/2010 | Berkley | |
| 7,858,966 B2 | 12/2010 | Kitaev | |
| 7,876,145 B2 | 1/2011 | Koch | |
| 7,876,248 B2 | 1/2011 | Berkley | |
| 7,880,529 B2 | 2/2011 | Amin | |
| 7,932,514 B2 | 4/2011 | Farinelli | |
| 7,932,515 B2 | 4/2011 | Bunyk | |
| 7,969,178 B2 | 6/2011 | Przybysz | |
| 7,990,662 B2 | 8/2011 | Berkley | |
| 8,018,244 B2 | 9/2011 | Berkley | |
| 8,035,540 B2 | 10/2011 | Berkley | |
| 8,076,666 B2 | 12/2011 | Bonderson | |
| 8,102,185 B2 | 1/2012 | Johansson | |
| 8,111,083 B1 | 2/2012 | Pesetski | |
| 8,117,000 B2 | 2/2012 | DiVincenzo | |
| 8,169,231 B2 | 5/2012 | Berkley | |
| 8,174,305 B2 | 5/2012 | Harris | |
| 8,195,596 B2 | 6/2012 | Rose | |
| 8,247,799 B2 | 8/2012 | Bunyk | |
| 8,294,138 B2 | 10/2012 | Farinelli | |
| 8,421,053 B2 | 4/2013 | Bunyk | |
| 8,611,974 B2 | 12/2013 | Maibaum | |
| 8,620,855 B2 | 12/2013 | Bonderson | |
| 8,648,331 B2 | 2/2014 | Bonderson | |
| 8,654,578 B2 | 2/2014 | Lewis | |
| 8,659,007 B2 | 2/2014 | Bonderson | |
| 8,670,807 B2 | 3/2014 | Rose | |
| 8,854,074 B2 | 10/2014 | Berkley | |
| 8,861,619 B2 | 10/2014 | McDermott | |
| 8,872,360 B2 | 10/2014 | Chow | |
| 8,878,626 B2 | 11/2014 | Zmuidzinas | |
| 8,928,391 B2 | 1/2015 | Naaman | |
| 8,975,912 B2 | 3/2015 | Chow | |
| 9,059,305 B2 | 6/2015 | Abraham | |
| 9,059,674 B2 | 6/2015 | Chow | |
| 9,111,230 B2 | 8/2015 | Gambetta | |
| 9,177,814 B2 | 11/2015 | Chang | |
| 9,178,154 B2 | 11/2015 | Bunyk | |
| 9,350,460 B2 | 5/2016 | Paik | |
| 9,355,364 B2 | 5/2016 | Miller | |
| 9,425,804 B2 | 8/2016 | Mcdermott, III | |
| 9,444,430 B1 | 9/2016 | Abdo | |
| 9,524,470 B1 | 12/2016 | Chow | |
| 9,548,742 B1 | 1/2017 | Abdo | |
| 9,589,236 B1 | 3/2017 | Abdo | |
| 9,633,314 B2 | 4/2017 | Kwon | |
| 9,691,962 B2 | 6/2017 | Abdo | |
| 9,697,473 B2 | 7/2017 | Abdo | |
| 9,768,771 B2 * | 9/2017 | Naaman | H03K 17/92 |
| 9,806,711 B1 | 10/2017 | Abdo | |
| 9,843,312 B2 | 12/2017 | Abdo | |
| 9,858,532 B2 | 1/2018 | Abdo | |
| 9,923,538 B2 | 3/2018 | Abdo | |
| 9,947,856 B2 | 4/2018 | Abdo | |
| 9,948,254 B2 | 4/2018 | Narla | |
| 9,985,614 B2 | 5/2018 | Abdo | |
| 10,998,869 B2 * | 5/2021 | Miano | H10N 60/12 |
| 2004/0167036 A1 | 8/2004 | Amin | |
| 2005/0250651 A1 | 11/2005 | Amin | |
| 2016/0308502 A1 | 10/2016 | Abdo | |
| 2017/0077381 A1 | 3/2017 | Abdo | |
| 2018/0034425 A1 * | 2/2018 | Bell | H03F 7/04 |
| 2018/0137430 A1 | 5/2018 | Chow | |
| 2018/0138987 A1 | 5/2018 | Sliwa | |
| 2018/0198427 A1 | 7/2018 | Narla | |
| 2018/0351521 A1 | 12/2018 | Abdo | |
| 2019/0074801 A1 * | 3/2019 | Tan | H03F 3/54 |
| 2019/0229690 A1 * | 7/2019 | White | H03K 19/1954 |

OTHER PUBLICATIONS

U.S. Appl. No. 10/516,375, filed Dec. 24, 2019, Matthew Bell.
U.S. Appl. No. 10/998,869, filed May 4, 2021, Alessandro Miano.
U.S. Appl. No. 11/955,934, filed Apr. 9, 2024, Alessandro Miano.
Nation, P. D., "Quantum analysis of a nonlinear microwave cavity-embedded dc SQUID displacement detector", Physical Review B 78, 104516, Sep. 2008, pp. 1-17 (Year: 2008).

* cited by examiner

SUPERCONDUCTING TRAVELING-WAVE PARAMETRIC AMPLIFIER

CROSS REFERENCE TO RELATED APPLICATIONS

The present application is a Continuation of U.S. patent application Ser. No. 17/246,535, filed Apr. 30, 2021, now U.S. Pat. No. 11,955,934, which is a Continuation of U.S. patent application Ser. No. 16/402,148, filed May 2, 2019, now U.S. Pat. No. 10,998,869, issued May 4, 2021, the entirety of which is expressly incorporated herein by reference.

FIELD OF THE INVENTION

The present invention relates to the field of superconducting integrated circuits, especially with application to quantum computing.

BACKGROUND OF THE INVENTION

All references cited herein are expressly incorporated herein by reference in their entirety, for all purposes.

There has been much attention recently to the use of superconducting integrated circuits for quantum computing, whereby the quantum bits or qubits may comprise Josephson junctions. These quantum computing systems are generally designed to operate at very low temperatures much less than 1 K. These systems further require control and output circuitry, which may also comprise superconducting circuits. See, for example, U.S. Pat. Nos. 7,135,701; 7,335,909; 7,002,174; 7,418,283; 6,838,694; 6,495,854; 6,979,836; 6,803,599; 7,253,654; 2005/0250651; 6,784,451; 6,459,097; 7,932,514; 7,268,576; 6,627,915; 7,800,395; 7,880,529; 7,605,600; 6504172; 8,174,305; 8,102,185; 7,015,499; 6,984,846; 7,687,938; 7,639,035; 8,648,331; 6,960,780; 8,247,799; 8,169,231; 6,897,468; 6,614,047; 8,117,000; 9,111,230; 7,018,852; 6,930,320; 6,900,454; 7,364,923; 6,649,929; 9,177,814; 8,659,007; 8,670,807; 6,573,202; 7,990,662; 8,611,974; 7,969,178; 7,876,145; 7,145,170; 7,843,209; 8,018,244; 9,524,470; 8,654,578; 8,928,391; 8,620,855; 7,858,966; 8,854,074; 9,350,460; 9,947,856; 9,059,305; 9,425,804; 9,633,314; 9,444,430; 7,876,248; 2004/0167036; 9,589,236; 7,479,652; 8,975,912; 9,059,674; 8,872,360; 7,498,832; 9,178,154; 8,294,138; 8,035,540; 8,195,596; 8,421,053; 2018/0137430; 7,932,515; 5,917,322; 8,111,083; 9,355,364; 9,691,962; 8,076,666; and 7,619,437.

A particular need is for amplifier circuits that can amplify the very weak microwave-frequency output signals from the superconducting quantum computing circuits. These amplifiers need to be extremely low in noise and power dissipation, and preferably can operate in the deep cryogenic environment of the quantum computing circuits. Traditional semiconductor transistor amplifiers are less than ideal in this environment. See, for example, U.S. Pat. No. 7,724,083; 2016/0308502; and 8,861,619.

Other applications for low-noise broadband superconducting microwave amplifiers include frequency multiplexed arrays of superconducting photon detectors and microwave receivers for astronomical systems. See, for example, U.S. Pat. No. 7,253,701; see also O. Noroozian, et al., "Superconducting parametric amplifiers: The next big thing in (Sub)millimeter-wave receivers", *Proc. URSI National Radio Science Meeting* (2018), iceexplore.iecc.org/abstract/document/8299679.

One type of amplifier, known as a parametric amplifier, comprises at least one nonlinear reactive device, such as a nonlinear inductor, and can be used to amplify high-frequency signals. As shown in FIG. 1, a parametric amplifier has two inputs, a weak input signal at $f_s$ and a strong pump at $f_p$. The nonlinear element generates an amplified output signal at $f_s$ and an "idler" output at difference frequency $f_i=(N-1)f_p-f_s$, where N>1 is the order of the nonlinear element responsible for the parametric amplification, generally with N=2 or 3. If N=2, this is sometimes called "three-wave mixing", while if N=3, this is called "four-wave mixing".

While a single-stage parametric amplifier may work well at frequencies that are not too high, a distributed parametric amplifier embedded in a transmission line may exhibit better performance over a broad range of microwave frequencies. This may be called a "traveling-wave parametric amplifier", or TWPA. A TWPA may comprise a basic cell which may be connected in a linear array of hundreds of cells or more.

An ideal linear transmission line comprises series inductors and shunt capacitors, as shown in FIG. 2. While distributed elements could be used, lumped elements L and C may alternatively be used, provided that the operating frequency range is much less than the resonance frequency $f_R=1/[2\pi\sqrt{(LC)}]$. The characteristic impedance of the transmission line is given by $Z_0=(L/C)^{1/2}$. So, if a nonlinear inductance is used in the transmission line, this may constitute a TWPA.

A superconducting Josephson junction is characterized by a lossless supercurrent $I=I_c \sin(\phi)$, where $I_c$ is the critical current, and $\phi$ is the superconducting phase difference across the junction. The Josephson junction generally comprises a tunnel junction between two superconducting layers (such as niobium or aluminum), separated by a thin insulating layer (such as aluminum oxide) on the 1-nm scale. In the low-current regime for $I<I_c$, the Josephson junction may be regarded as an ideal lossless nonlinear inductor, with inductance value (for small currents) $L_J=\hbar/[2I_c \cos(\phi)]=\Phi_0/[2\pi I_c \cos(\phi)]$, where $\Phi_0=h/2e=2.07$ pH-mA is the magnetic flux quantum. For example, if $I_c=0.1$ mA, $L_J$ will be of order 3 pH, depending on the phase bias $\phi$.

A Josephson junction can also generate single-flux-quantum (SFQ) voltage pulses for currents above $I_c$, which provides the basis for rapid-single-flux-quantum (RSFQ) digital logic. However, this regime is outside the scope of the present application, which focuses on small input currents below $I_c$. (Note that, in some regimes of operation, input signals to the present invention may be above $I_c$.) Furthermore, a real Josephson junction may also have an effective shunt capacitance and a shunt resistance. There may also be a component of linear inductance associated with the superconducting leads of the Josephson junction. In the present application, the nonlinear inductive component $L_J$ is typically expected to be dominant.

Josephson parametric amplifiers are known in the prior art, both as single-stage amplifiers, and more recently, TWPAs. Sec, for example, US 2016/0308502; 9,548,742; 9,923,538; 8,878,626; 9,843,312; 9,697,473; 9,806,711; 9,985,614; 2018/0351521; 2017/0077381; 9,948,254; 2018/0034425; 9,858,532; 2018/0138987; and 2018/0198427.

See also the following articles in the non-patent literature:
M. Bell and A. Samolov, "Traveling-Wave Parametric Amplifier Based on a Chain of Coupled Asymmetric SQUIDs". *Phys. Rev. Applied*, vol. 4, 024014 (2015).
N. Bergeal, et al., "Analog information processing at the quantum limit with a Josephson ring modulator," *Nature Physics* vol. 6, pp. 296-302 (2010).

M. Castellanos-Beltran and K. Lehnert, "Widely tunable parametric amplifier based on a SQUID array resonator", *Appl. Phys. Lett.*, vol. 91, 083509 (2007).

Z. Lin, et al., "Single-shot readout of a superconducting flux qubit with a flux-driven Josephson parametric amplifier," *Appl. Phys. Lett.*, vol. 103, 132602 (2013).

C. Macklin, et al., "A near-quantum-limited Josephson traveling-wave parametric amplifier", *Science*, Vol. 350, Issue 6258, pp. 307-310 (2015).

J. Mutus, et al., "Design and characterization of lumped element single-ended superconducting microwave parametric amplifier with on-chip flux bias line," *Appl. Phys. Lett.*, vol. 103, 122602 (2013).

O. Naaman, et al., "High saturation power Josephson parametric amplifier with GHz bandwidth", arxiv.org/abs/1711.07549 (2017).

L. Planat, et al, "Understanding the saturation power of Josephson parametric amplifiers made from SQUID arrays", arxiv.org/abs/1809.08476 (2018).

T. Roy, et al., 2015, "Broadband parametric amplification with impedance engineering: Beyond the gain-bandwidth product", *Appl. Phys. Lett.*, vol. 107, 262601 (2015).

M. P. Westig and T. M. Klapwijk, "Josephson Parametric Reflection Amplifier with Integrated Directionality" *Phys. Rev. Applied*, vol. 9, 064010 (2018).

T. White et al., "Traveling wave parametric amplifier with Josephson junctions using minimal resonator phase matching", *Appl. Phys. Lett.*, vol. 106, 242601 (2015).

O. Yaakobi, et al., "Parametric amplification in Josephson junction embedded transmission lines," *Phys. Rev. B*, vol. 87, 144301, (2013).

T. Yamamoto, et al., "Flux-driven Josephson parametric amplifier", *Appl. Phys. Lett.*, vol. 93, 042510 (2008).

A. Zorin, "Josephson traveling wave parametric amplifier with 3-wave mixing", *Phys. Rev. Applied*, vol. 6, 034006 (2016).

A. Zorin, et al, "Josephson traveling wave parametric amplifier based on 3-wave mixing in a Josephson meta-material", *Proc. International Superconductive Electronics Conf.* (2017). iceexplore.icce.org/document/8314196.

There is another type of superconducting TWPA designed without Josephson junctions, where the nonlinear element comprises a superconducting thin film with nonlinear kinetic inductance. However, this nonlinearity is much weaker than that in a Josephson junction, so that a very long transmission line is needed to obtain sufficient gain, making compact amplifiers very difficult to achieve. See U.S. Pat. No. 8,878,626; also the following non-patent literature:

A. Adamyan, et al., "Superconducting microwave parametric amplifier based on a quasi-fractal slow propagation line," *Journal of Applied Physics*, vol. 119, 083901 (2016).

A. Eom, et al., "Wideband, low-noise superconducting amplifier with high dynamic range", *Nature Physics*, vol. 8, pp. 623-627 (2012).

M. Vissers et al., "Low noise kinetic inductance traveling-wave amplifier using three-wave mixing", *Appl. Phys. Lett.*, vol. 108, 012601 (2016).

Two types of Josephson TWPAs have recently been disclosed in the prior art. In the basic Josephson TWPA shown in FIG. 3A, each linear inductor is replaced with a Josephson junction, indicated by an "X". If the cell has inductance $L_J \sim 3$ pH and capacitance $C \sim 1$ pF, the resonant frequency would be $\sim 100$ GHz, enabling a transmission line structure that could operate through the microwave regime. An alternative Josephson TWPA is shown in FIG. 3B. Here, each Josephson junction is shunted by a (linear) superconducting inductor comparable in magnitude to $L_J$. This combination of a Josephson junction with a parallel inductance is known in another context as an rf-SQUID or one-junction SQUID, which can be used for magnetic field detection. [The one-junction SQUID differs from the more commonly used two-junction SQUID or dc SQUID, which generally operates with a current bias of $I > I_c$.] This changes the effective inductance, but more importantly, it permits the phase $\phi$ across each Josephson junction to be biased with an external dc magnetic field, which creates a magnetic flux $\Phi$ in the loop. Alternatively, this flux bias may be achieved by inductively coupling magnetic flux into the loop from the current in an adjacent control line. When the loop inductance L is small ($\beta_L = 2\pi L I_c/\Phi_0 \ll 1$), the flux bias is equivalent to a phase bias given by $\phi = 2\pi\Phi/\Phi_0$. More generally, the relation between $\phi$ and $\Phi$ is given by the following equation: $\phi + \beta_L \cdot \sin(\phi) = 2\pi\Phi/\Phi_0$. The condition $\beta_L < 1$, known as the non-hysteretic or dispersive mode, ensures that the relation between $\phi$ and $\Phi$ is single-valued. For operation as an rf-SQUID, typically $\beta_L \sim 0.8$ is selected, so that the mutual inductance M between the control line and the SQUID loop is large enough for sensitive control with small currents, while maintaining non-hysteretic operation.

It is important to note that the phase bias changes the nature of the nonlinearity. Specifically, the second-order nonlinear coefficient is proportional to $\sin(\phi)$, and the third-order coefficient is proportional to $\cos(\phi)$. In greater detail (see A. Zorin, "Josephson traveling wave parametric amplifier with 3-wave mixing", *Phys. Rev. Applied*, vol. 6, 034006 (2016)), the junction current I is given by $$I(\phi+\delta\phi) \approx I_c \sin(\phi)(1-\delta\phi^2/2) + I_c \cos(d)(\delta\phi - \delta\phi^3/6),$$

where $\delta\phi$ is the change in the phase due to the input microwave signal.

For the unbiased junction in FIG. 3A, $\phi=0$, so that only the third-order coefficient is present. This third-order nonlinearity enables amplifier gain, but the same nonlinearity also creates phase modulation. This phase modulation can cause signal distortion, which may be canceled by the use of a phase-matching network, indicated by the impedance Z in FIG. 3A. However, the presence of the phase-matching network introduces a tradeoff between bandwidth and gain, as well as increasing the size and complexity of the circuit. For example, the phase-matching network may be a resonant circuit that can insert a stop-band in the gain curve.

In contrast, in the TWPA of FIG. 3B, adjustment of the phase permits one to obtain a mix of second and third-order nonlinear terms, enabling somewhat improved performance without the need for a phase-matching network. However, with only a single tuning parameter, the various parameters of the TWPA cannot be fully optimized.

The prior art fails to disclose a compact Josephson TWPA that can achieve high gain, low noise, and wide microwave bandwidth with improved control over tuning, compared to the prior art of either FIG. 3A or FIG. 3B. In this way, both gain and bandwidth can be independently optimized without the need for a phase-matching network. Such an amplifier could have widespread application to low-noise, low-dissipation amplification of weak broadband microwave signals from cryogenic systems such as quantum computers, superconducting sensor arrays, and quantum-limited microwave receivers.

SUMMARY OF THE INVENTION

In order to allow independent control of both second and third-order Josephson nonlinearities, a three-wave mixing "Symmetric Traveling Wave Parametric Amplifier" (STWPA) was developed, based on a new symmetric rf-SQUID (FIG. 4) in place of the more standard rf-SQUID in FIG. 3B. This has two control currents, rather than the single control current of FIG. 3B.

Basics of the TWPA are presented with three-wave mixing, and the symmetric approach to TWPA design is explained showing its advantages.

A preferred embodiment of such a structure has been simulated, and a preliminary prototype device successfully fabricated and tested. Experimental measurements demonstrated TWPA operation at a temperature of 4.2 K, showing a gain up to 17 dB and a 3-dB bandwidth of 4 GHz. Further improvements in performance are anticipated as the device is further optimized. Sec, Alessandro Miano, and Oleg A. Mukhanov, "Symmetric Traveling Wave Parametric Amplifier", IEEE Trans. Appl. Supercond. 2019, arxiv.org/abs/1811.02703 (Applied Superconductivity Conference, October 2018).

As indicated in FIG. 4, a symmetric rf-SQUID is obtained by shunting two identical rf-SQUIDs, with a small parasitic inductance $L_p$ connecting the two rf-SQUIDs. This shows two distinct control currents $I_1$ and $I_2$, which are located proximate to the respective inductive loops $L_1$ and $L_2$ of the constituent rf-SQUIDs, and coupled magnetic flux $\Phi_1$ and $\Phi_2$ into the loops via mutual inductance $M_1$ and $M_2$. There is preferably negligible magnetic flux $\Phi_c \sim 0$ coupled into the central loop between the two Josephson junctions.

A symmetric rf-SQUID was designed in a niobium integrated circuit process with Josephson junctions having critical current density $J_c=100$ A/cm$^2$ (1 μA/μm$^2$) at T=4.2 K. Typical critical currents $I_c$ were selected to be in the range from 4 to 12 μA, corresponding to junction sizes ~2-3 μm across. Loop inductances L were selected so that $\beta_L \approx 0.8$ for each rf-SQUID, maintaining the non-hysteretic mode. Typical values were L~30 pH. The small parasitic inductances $L_p$ connecting the two rf-SQUIDs were designed to be as small as possible, typically ~3 pH or less. A current in a superconducting control line is inductively coupled to the SQUID loop on each side via a mutual inductance M=kL, where k<1. Control current up to 1 mA were used to produce magnetic flux in the loops up to $\Phi_0=2$ fWb. Several different devices with different parameters have been designed, but in each case, the device is preferably symmetric, with $I_c$ and L essentially the same on both sides of the device.

Each of the two Josephson junctions in the symmetric rf-SQUID will have its own phase ϕ, loop flux Φ, and control current I. The symmetric and antisymmetric combinations of these parameters are particularly important, for example $\phi_+=(\phi_1+\phi_2)/2$, $\Phi_+=(\phi_1-\phi_2)/2$, $\Phi_+=(\Phi_1+\Phi_2)/2$, and $\Phi_-=(\Phi_1-\Phi_2)/2$. FIG. 5A shows the theoretical relations of $\phi_+$ and $\phi_-$ on flux biases $\Phi_+$ and $\Phi_-$, for specified values of symmetric parameters. FIG. 5B shows how a full range of values of nonlinearity parameters β and γ of the symmetric rf-SQUID can be tuned by appropriate selection of $\phi_+$ and $\phi_-$, or equivalently, by flux bias $\Phi_1$ and $\Phi_2$, or current bias $I_1$ and $I_2$. This is the key distinction over the prior art, in which only a partial subset of values of β and γ could be obtained.

In order to construct a symmetric TWPA (STWPA) from the symmetric rf-SQUID, N of these SQUIDs must be integrated with appropriate values of capacitance C, to create a nonlinear transmission line with an effective characteristic impedance $Z_0$. The prototype circuits were designed to match $Z_0=50$ ohms, in order to match external I/O lines for testing. For a typical symmetric rf-SQUID with an effective inductance L~10 pH (which depends somewhat on values of control parameters), a capacitance C~4 fF is required to achieve $Z_0=(L/C)^{0.5}=50$ ohms.

A repeated cell for the STWPA may comprise a single symmetric rf-SQUID with a capacitive shunt to ground, as shown in FIG. 6. Alternatively, a cell may comprise a supercell with two or more SQUIDs in series, with a proportionally larger capacitance to ground. Such a supercell should be functionally equivalent, provided only that the effective wavelength at the frequency of interest is larger than the size of a supercell. The optimum value of N may be of order 100 or greater, depending on the value of nonlinearity parameters and the pump power.

FIG. 7 shows a photograph of a prototype STWPA chip, embedded in a block diagram of the measurement configuration. This was a 5 mm×5 mm integrated circuit fabricated using niobium Josephson junctions with a critical current density $J_c=100$ A/cm$^2$ at 4.2 K. On the chip, the STWPA is visible, connected to the measurement setup and diagnostic circuits through the electrical contacts around the periphery of the chip. Input and control lines are connected on the left, and the output line on the right. All sources and measurements were carried out using instruments at room temperature (300 K). Pump and signal tones were generated by two independent microwave generators, and mixed with a power combiner. Two independent current generators were used to apply an external magnetic flux to loops on the top and bottom of the STWPA. The microwave output power was measured as a function of frequency with a spectrum analyzer. The pump frequency was $f_p=10.2$ GHz with a power of −65 dBm; the signal frequency $f_s$ was varied from 3.4 to 9.4 GHz, with an input power (after 20 dB attenuation) of −120 dBm. Bias current values were ~ 1 mA, of either sign.

An example of the operation of such a prototype STWPA is shown in FIG. 8, which plots the gain of the SWTPA vs. the frequency of the input signal, for fixed pump power and control currents. The pump frequency here was 10.2 GHZ. The gain of the SWTPA is defined here as the ratio of output power in the "ON" state (pump and control currents on) over that in the "OFF" state, for the same input signal. The dip at 4.9 GHZ was not anticipated, and may be due to a resonance effect associated with imperfect device fabrication or a mismatch in the test setup. It is believed that further device optimization will lead to a flat gain of more than 12 dB across a 4 GHz bandwidth. Furthermore, careful adjustment of the pump power for this device led to a maximum gain of as high as 17 dB.

A further illustration of the performance of this device is shown in FIG. 9, which plots the output power of the device at the frequency of the input signal as a function of control currents $I_1$ and $I_2$, when the pump power is turned off. The output power is periodic in $I_+=(I_1+I_2)/2$ (the diagonal lines in FIG. 9), with a periodicity of 0.625 mA. This corresponds to a flux periodicity of Po. These lines correspond to a minimum output power, because a large part of the input power is being converted by the nonlinearity to the second harmonic frequency.

FIG. 10 shows the output power at the signal frequency with and without the pump power for a similar STWPA with somewhat different design parameters. Here the diagonal line in the center shows a sharp reduction of the output power with the pump off (FIG. 10A), but a sharp increase in output power with the pump turned on (FIG. 10B). The latter is due to nonlinear conversion of the (larger) pump power to signal power, overcoming the depletion of signal power to second harmonic. The maximum ratio of the ON power to the OFF power was generally quite large, of order 20 dB or more (a factor of 100). This suggests that this device may also have application as a pump-driven RF switch.

The nonlinearity in the STWPA also causes conversion of pump power to the idler frequency $f_i=f_p-f_s$ (if $f_p>f_s$) or $f_s-f_p$ (if $f_s>f_p$), reflecting the second-order parametric conversion process (three-wave mixing). This suggests that this device could also be used as a coherent up-down converting RF mixer for weak signals, replacing a more conventional resistive mixer. Such a superconducting parametric mixer would be extremely low in power dissipation, and might even be used at ultra-low temperatures below 1 K, such as for a quantum computing element in a dilution refrigerator.

The present technology also provides a more general method for parametric amplification of weak signals. As shown in FIG. 11, this comprises first designing an appropriate tunable nonlinear inductance, which may exhibit $2^{nd}$-order and $3^{rd}$-order nonlinearities that may be controlled by external control lines. A series array of these tunable inductances may be combined with shunt capacitors to form stages of a lumped-element transmission line. If a weak microwave input signal is combined with a stronger pump and coupled to the input of the transmission line, the output of the transmission line will present amplified replicas of the input signal in at least two frequency channels: the input signal frequency itself, and a frequency-shifted idler channel. This output may be characterized for several figures of merit including gain, bandwidth, distortion, and noise. Repeated adjustment of the tunable nonlinear inductance may lead to optimization of the device performance. Further, this external control loop may be automated.

In summary, a system and method are disclosed for a superconducting traveling-wave parametric amplifier (TWPA) with improved control and performance. In a preferred embodiment, the amplifier comprises an integrated array of symmetric rf-SQUIDs in a transmission line structure.

A prototype device was fabricated using niobium superconducting integrated circuits, and confirmed predicted performance, with a maximum gain up to 17 dB and a bandwidth of 4 GHZ.

A similar device can be applied as a low-noise, low-dissipation microwave amplifier for output from a superconducting quantum computer, or as a preamplifier, switch, or frequency converter for a sensitive microwave receiver, or as an output amplifier for a frequency-multiplexed superconducting detector array.

It is thus an object of the invention to disclose a traveling-wave parametric amplifier, comprising a plurality of amplifier stages, where each stage comprises a serial inductor and a shunt capacitor, and the successive stages are configured to form a lumped-element microwave transmission line. The amplification is enabled by the property that the serial inductor is a nonlinear function of the total signal in the inductor, which comprises at least two Josephson junctions. The amplifier is configured to have an input port, and output port, and two control ports. The input signal to be amplified is combined with a microwave pump that lies outside the bandwidth of the input signal, and the combination is fed into the input port of the amplifier. The output port is configured to generate an output microwave signal that comprises an amplified replica of the input signal. The control ports are configured to accept two independent low-frequency currents, each of which modulates the nonlinear inductance of the serial inductor of each amplifier stage.

It is also an object to provide a traveling-wave parametric amplifier, comprising: an input port configured to receive a signal comprising a combination of an input microwave signal, and a microwave pump signal having a pump frequency which is outside a bandwidth of the input microwave signal; a plurality of successive repeated amplifier stages configured to form a microwave transmission line, each amplifier stage comprising a shunt capacitor and a serial inductor, an inductance of the serial inductor of each amplifier stage being a nonlinear function of a total signal in the serial inductor; at least two control ports configured to accept at least two control signals, each of which modulates the inductance of the serial inductor of each amplifier stage; and an output port, configured to present an output microwave signal comprising an amplified replica of the microwave input signal. Each serial inductor may comprise at least two Josephson junctions. The Josephson junctions may comprise the superconductors niobium or aluminum. The plurality of successive repeated amplifier stages may be configured to operate at a temperature of 4.2 K or less, e.g., <1 K.

The serial inductor of each amplifier stage may comprise at least one Radio Frequency superconducting quantum interference device (rf-SQUID), comprising a Josephson junction in parallel with an inductive loop. The serial inductor of each amplifier stage may comprise two parallel rf-SQUIDs. The two parallel rf-SQUIDs may be mutually symmetrical, constituting a symmetric rf-SQUID. The inductive loop of each rf-SQUID may be configured to inductively couple magnetic flux from a respective control signal in proximity to the loop.

The serial inductor of each amplifier stage may exhibit a second-order nonlinearity and a third-order nonlinearity, the two control signals being configured to separately control the second-order nonlinearity and the third-order nonlinearity of each amplifier stage.

The traveling-wave parametric amplifier may comprise at least 100 repeated stages of the plurality of successive repeated amplifier stages.

The input port may be configured to receive an input microwave signal having frequency components in the range of 3-10 GHz and a power level of −120 dBm or less. The microwave pump signal may have a pump frequency of about 10 GHz and a pump power level of about −65 dBm. The output port may be configured to present the output microwave signal exhibiting a signal power gain greater than 12 dB with respect to the input microwave signal. Each control signal may comprise an electrical current between about 1 μA and 10 mA, and preferably 100 HA-1 mA.

The input port and/or output port may match a microwave impedance of about 50 ohms.

The output port may be further configured to present a frequency-shifted replica of the input signal at a frequency $2f_p-f_s$, where $f_p$ is the pump frequency and $f_s$ is a component of the input microwave signal.

The plurality of successive repeated amplifier stages may be responsive to the microwave pump signal to increase a power of the output microwave signal by at least 20 dB with respect to an absence of the pump microwave signal.

The input port may be configured to receive signals from superconducting qubits and/or from superconducting photon detectors.

It is a further object that the nonlinear inductor of this TWPA comprises at least one rf-SQUID comprising a Josephson junction in parallel with an inductive loop, or preferably two such rf-SQUIDs connected in parallel. These two rf-SQUIDs may be symmetrical, comprising a symmetric rf-SQUID. Each of the two loops of this symmetrical rf-SQUID is preferably inductively coupled to current from a respective control line in proximity to each loop, which couples magnetic flux into each loop, magnetically tuning its nonlinearity. The nonlinearity may comprise both a second-order and a third-order nonlinearity, which may be separately tuned by the two control lines.

It is a yet further object that this TWPA may be fabricated on a single chip using integrated circuit techniques, and that the Josephson junctions may comprise niobium, for devices designed to operate at 4.2 K, or alternatively they may comprise aluminum, for devices designed to operate at less than 1 K. The number of amplifier stages in the TWPA may be 100 or more.

In a still further object, this TWPA may be designed to match input and output lines with characteristic impedance of about 50 ohms, and for an input signal having frequency components in the range from 3-10 GHz, and a very low input power of −120 dBm or less. The pump power is typically much larger, of order −65 dBm, at a frequency that is outside the input signal band, but which may also be around 10 GHz. The control lines may be designed for control currents of order 1 mA, in order to provide sufficient tunability of the nonlinear inductance of the TWPA. The signal power gain of the TWPA may be greater than 12 dB, and the effect of turning off the pump power may attenuate the output signal power by 20 dB or more.

An additional object describes the TWPA as an output amplifier for weak signals from cryogenic quantum computers or superconducting photon detectors. Alternatively, the TWPA may be used as a frequency-shifted amplifier, whereby the output port further generates a frequency-shifted replica of the input signal at a frequency $f_p$-$f_s$, where $f_p$ is the pump frequency and $f_s$ is a component of the input signal.

It is also an object to disclose a method of amplifying a weak broadband microwave input signal at cryogenic temperatures, comprising the steps of:

1. Designing a nonlinear tunable superconducting inductor, with nonlinear properties that may be tuned using external controls.
2. Fabricating a series array of tunable inductors and shunt capacitors to form a transmission line that comprises a distributed amplifier with input, output, and control lines;
3. Cooling to a cryogenic temperature below the critical temperature of the superconducting inductors;
4. Combining the input signal with a strong microwave pump that is offset in frequency from the input signal, and inserting the combined signal into the input amplifier;
5. Measuring the output of the amplifier at the signal and/or idler frequencies for gain, bandwidth, and distortion; and
6. Tuning the nonlinearities of the inductors using the control lines to optimize performance.

It is also an object to provide a method of amplifying a weak broadband microwave input signal emitted from a device operating at cryogenic temperatures, comprising: providing a series of nonlinear tunable superconducting inductors, each having nonlinear properties tunable using external controls, in a series array, each nonlinear tunable superconducting inductor having an associated shunt capacitor, the series array forming a transmission line that comprises a distributed amplifier with input, output, and control lines; cooling the distributed amplifier to a cryogenic temperature below the critical temperature of the nonlinear tunable superconducting inductors; combining the input signal with a strong microwave pump signal that is offset in frequency from the input signal to form a combined signal; coupling the combined signal into the input port of the distributed amplifier; measuring the output of the distributed amplifier for gain, bandwidth, and distortion; and tuning nonlinearities of the nonlinear tunable superconducting inductors using the control lines to optimize the performance of the distributed amplifier, based on the gain, bandwidth, and distortion.

It is a further object to provide a tunable superconducting microwave inductor, comprising: two radio frequency superconducting quantum interference devices (rf-SQUIDs) in parallel, each rf-SQUID comprising a Josephson junction in parallel with an inductive loop, an inductance value of the tunable superconducting microwave inductor being dependent on an amplitude of a microwave current in the tunable superconducting microwave inductor, comprising a nonlinear function of the amplitude with terms that are at least one of quadratic and cubic in the amplitude; and a control port configured to receive a control current coupling magnetic flux into the inductive loop of each rf-SQUID, to thereby tune the inductance value and the nonlinearity of the inductance value of the tunable superconducting microwave inductor. The tunable superconducting microwave inductor may further comprise a plurality of tunable superconducting microwave inductors, each having an associated capacitor, provided as respective repeated stages in a microwave transmission line configured to function as a traveling-wave parametric amplifier; wherein a gain and a bandwidth of the traveling-wave parametric amplifier is tunable by the control current received at the control port.

Finally, it is yet another object to provide a tunable superconducting microwave inductor, comprising two rf-SQUIDs in parallel, each rf-SQUID comprising a Josephson junction in parallel with an inductive loop, whereby the inductance value of the tunable inductor is dependent on the amplitude of the microwave current in the inductor, comprising a nonlinear function of amplitude with terms that are quadratic and/or cubic in the amplitude, and whereby application of control currents coupling magnetic flux into the inductive loops permits tuning of the inductance value of the tunable inductor and its nonlinearities. This tunable inductor may be combined with a fixed capacitor to form a repeated stage in a microwave transmission line, which can function as a traveling-wave parametric amplifier (TWPA), whereby the gain and bandwidth of the TWPA may be optimized by tuning of the tunable inductors using the control currents.

Other objects will become apparent through a review of the description provided herein.

BRIEF DESCRIPTION OF THE DRAWINGS

FIG. 10B shows the output power of the STWPA with the pump turned on.

DETAILED DESCRIPTION OF THE PREFERRED EMBODIMENTS

Figure 1:
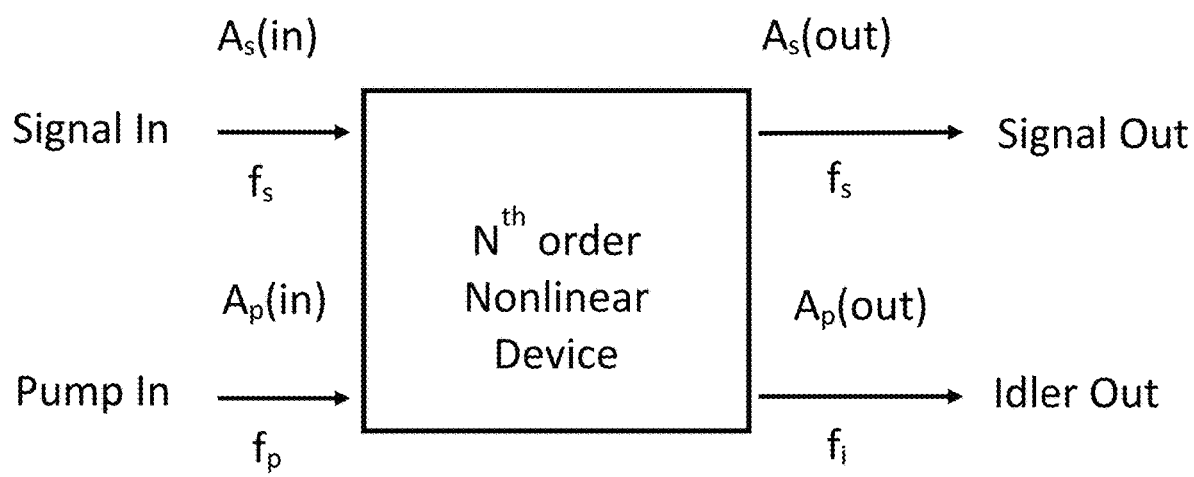
FIG. 1 (prior art) shows a generic block diagram of a parametric amplifier.

Superconducting quantum computing demands non-dissipative, quantum-limited cryogenic amplifiers. In order to improve scalability to many qubits, wide-bandwidth amplifiers are required for readout of multiple qubits which can be sensed with a single amplifier. Josephson Parametric Amplifiers (JPAs) were introduced to meet these needs, and proposed in many different designs. As a parametric amplifier, the JPA transfers power from a strong microwave tone (the pump) to a weak one (the signal), as well as to the idle frequency $f_i=f_p-f_s$ (see FIG. 1). It has the advantage of operating at cryogenic temperatures with very low loss, as well as having the strong intrinsic nonlinearity of the Josephson inductance. While achieving good gain and noise performance, JPAs cannot guarantee a wide instantaneous bandwidth for many-qubit multiplexing, because of a lumped-circuit based design.

Figure 2:
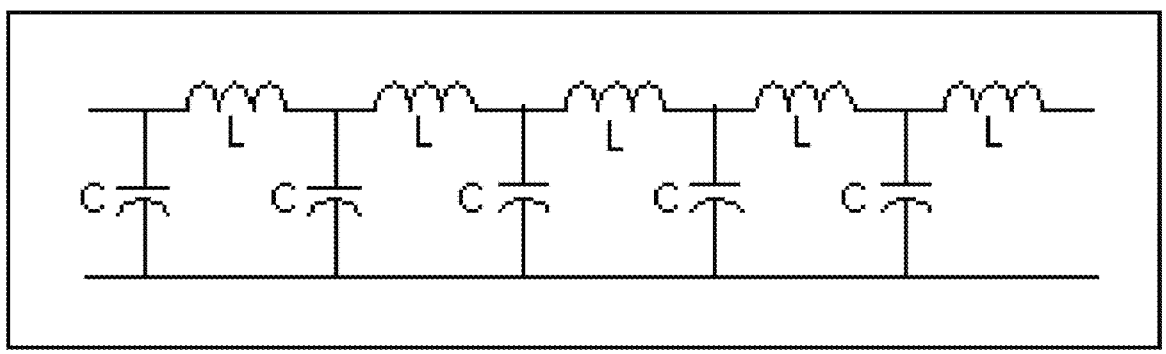
FIG. 2 (prior art) shows the circuit diagram of a nonlinear transmission line.

An alternative approach is built around a superconducting transmission line, consisting of superconducting inductors and capacitors (see FIG. 2). If the superconducting inductor is nonlinear, that can create a Traveling-Wave Parametric Amplifier, or TWPA. Good gain-bandwidth results have been achieved by exploiting the weak nonlinear kinetic inductance of NbTiN films, but very long lengths on the order of meters are required, leading to difficult integration.

Figure 3A:
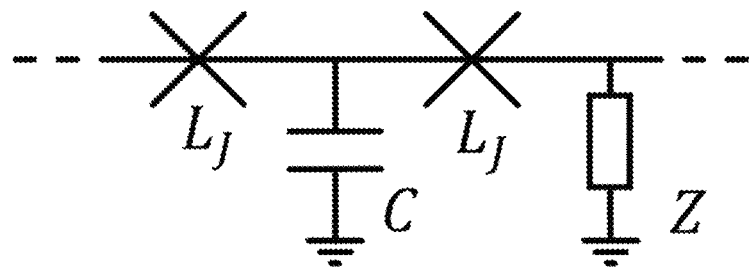
FIG. 3A (prior art) shows the circuit diagram of a basic Josephson TWPA, where the inductance L has been replaced with a Josephson junction.
Figure 3B:
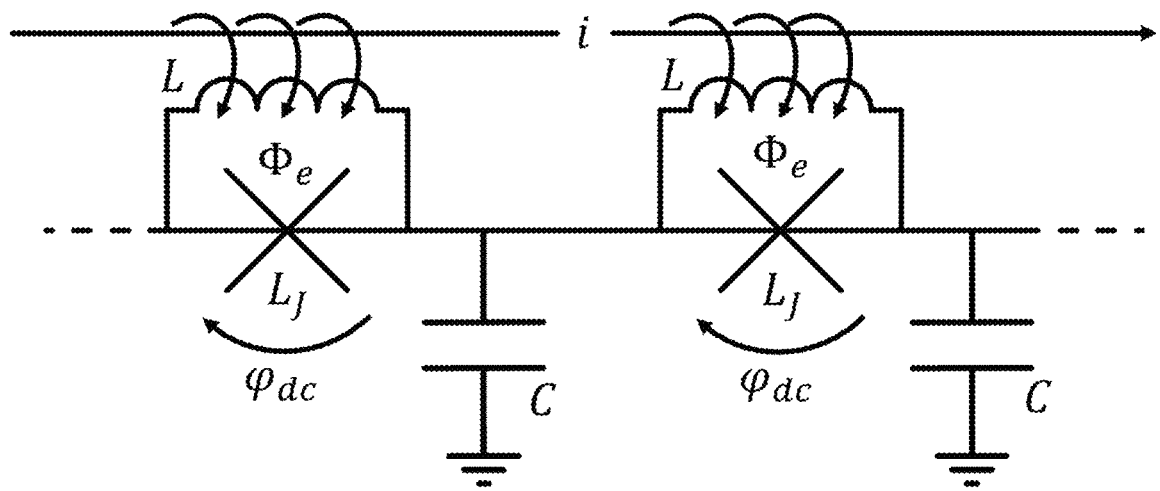
FIG. 3B (prior art) shows the circuit diagram of an alternative Josephson TWPA, where the inductance L has been replaced with an rf-SQUID.

Recently, the Josephson Traveling Wave Parametric Amplifier (JTWPA) was introduced as a nonlinear transmission line containing Josephson junctions as the nonlinear inductor. Two different approaches were demonstrated in the prior art, as depicted in FIG. 3: using a single Josephson junction as the nonlinear inductor (see FIG. 3A), and using an rf SQUID (a Josephson junction in parallel with a linear resistor, see FIG. 3B) as the nonlinear inductor. Both of these approaches can achieve high gain and good bandwidth, but both have problems. The basic Josephson TWPA is based on a third-order nonlinearity, and requires a resonant circuit at each stage to cancel phase modulation distortion.

The rf-SQUID approach uses external flux bias to tune the nonlinearity, and can take advantage of more efficient second-order nonlinearity. However, with a single DC flux bias, second and third order nonlinearities cannot be independently tuned, limiting the performance.

To allow independent control of both second and third order Josephson nonlinearities, two independent control currents are needed.

The Symmetric Traveling Wave Parametric Amplifier (STWPA) according to the present technology is based on a new symmetric rf-SQUID scheme. \

Experimental measurements of the first wafer demonstrated the correct TWPA operation at 4.2 K, showing a gain up to 17 dB and a 4 GHz 3 dB bandwidth.

Figure 4:
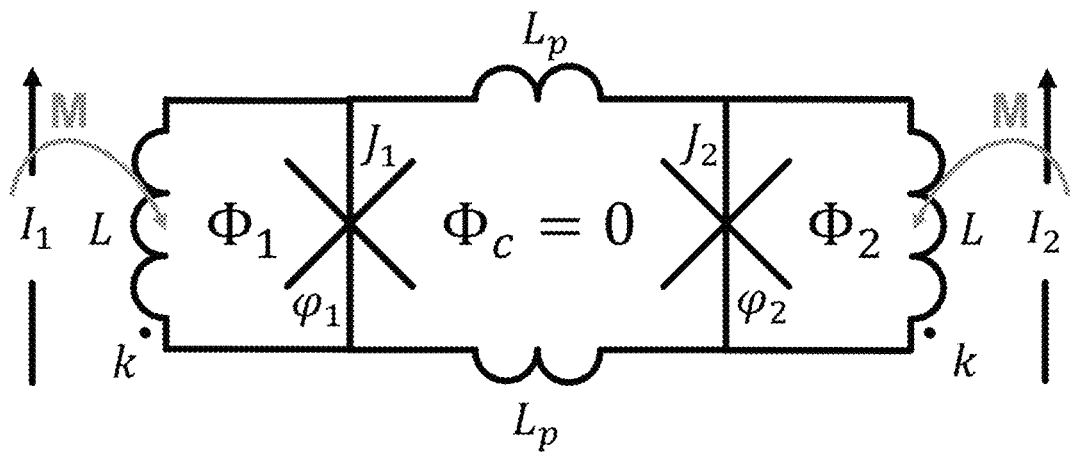
FIG. 4 shows the circuit diagram of a symmetric rf-SQUID.

The key to understanding the performance of the STWPA lies in the nonlinear behavior of the symmetric rf-SQUID with two coupling loops. A symmetric rf-SQUID is obtained by shunting two identical rf-SQUIDs. Taking into account a small parasitic inductance $L_p$ connecting the two rf-SQUIDs, the schematic in FIG. 4 is obtained. The circuit equations can be expressed in terms of the symmetric and antisymmetric phase and flux parameters $$\phi_+ = (\phi_1+\phi_2)/2,\ \phi_- = (\phi_1-\phi_2)/2,\ \Phi_+ = (\Phi_1+\Phi_2)/2,$$

and $\Phi_- = (\Phi_1-\Phi_2)/2$, as:

$$\phi_+ + \beta_L(1+k)\sin(\phi_+)\cos(\phi_-) = 2\pi\Phi_-/\Phi_0,$$

$$\phi_+ + \beta_L[(1+k)/(1+\alpha)]\sin(\phi_-)\cos(\phi_+) = [2\pi/(1+\alpha)]\Phi_+/\Phi_0,$$

where $\alpha=L(1-k)/L_p>1$ and $k=M/L$ is the normalized mutual inductance.

Figure 5A:
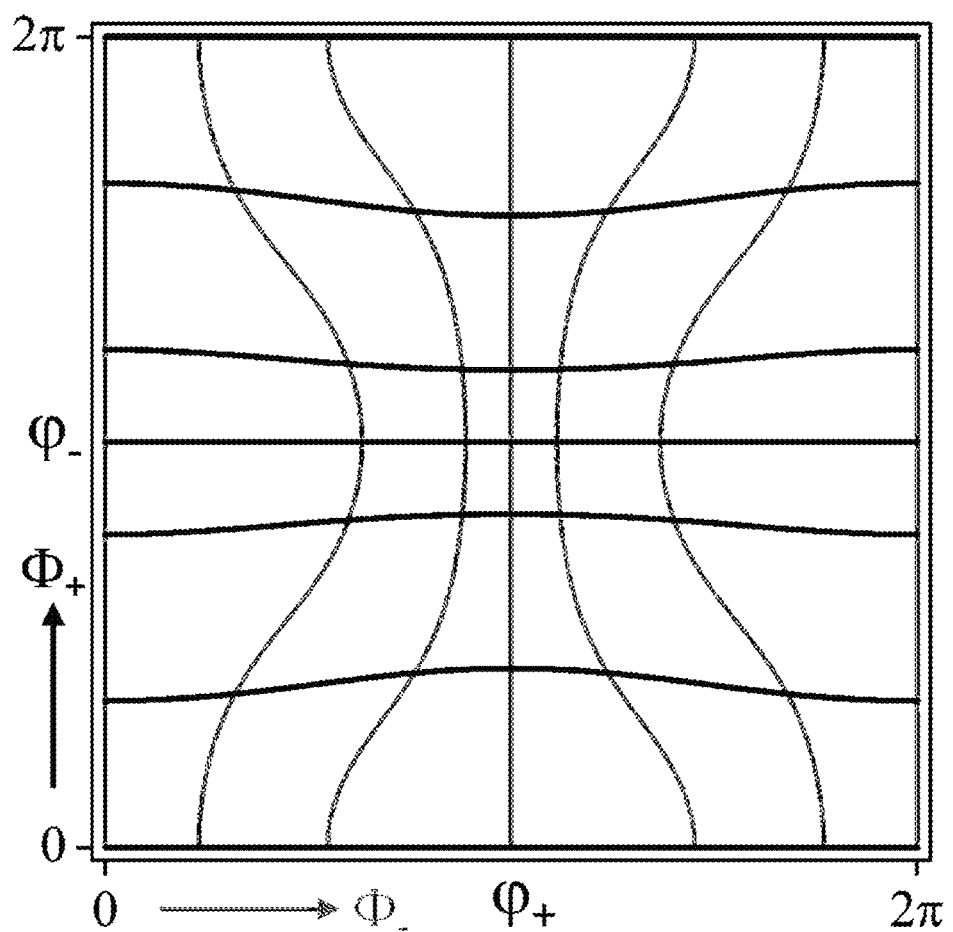
FIG. 5A shows the flux-phase relation for the symmetric rf-SQUID.

FIG. 5A shows a graph where $\beta_L=0.8$, $\alpha=5$, and $k<<1$. The relation between these parameters is single-valued if $\beta_L<1$, which defines the preferred non-hysteretic or diffusive mode.

Figure 5B:
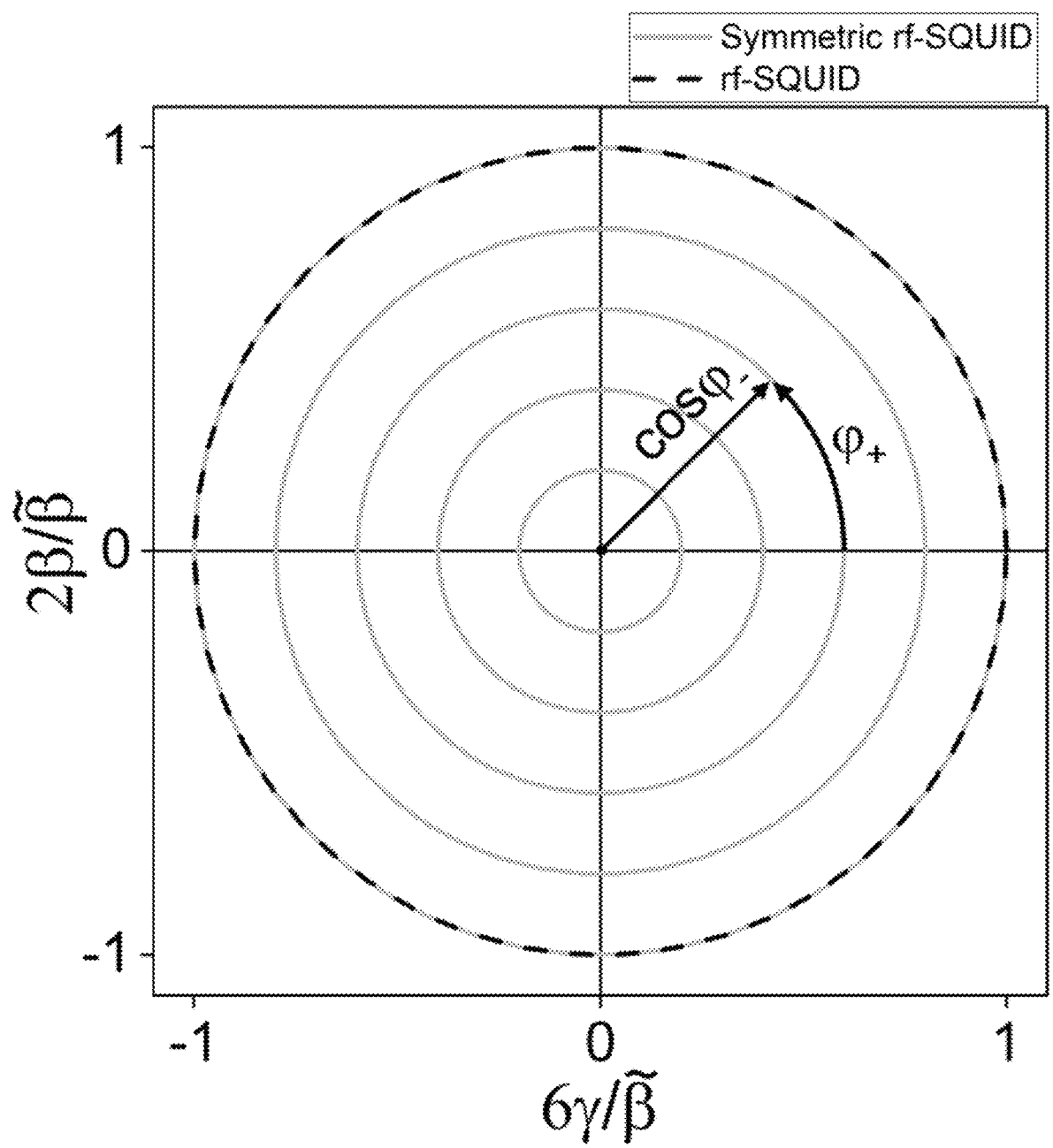
FIG. 5B shows the dependence of nonlinearity parameters on phase bias of the symmetric rf-SQUID.

One can further show that for reasonably large values of $\alpha$, the second-order and third-order nonlinearity parameters are given respectively by $\beta=(\beta_L/2)\cos(\phi_-)\sin(\phi_+)$ and $\gamma=(\beta_L/6)\cos(\Phi_-)\cos(\phi_+)$, which are plotted in FIG. 5B. (Note that $\beta$ with ~ on top in FIG. 5B is the same as $\beta_L$ here.) For a conventional rf-SQUID, only the outer circle is accessible. In contrast, for the symmetric rf-SQUID, any set of parameters inside the circle is also accessible. This enables a much higher degree of control. More specifically, each point on a circle represents a radius $r=|\cos(\phi_-)|$ and angle $\phi_+$.

To integrate a symmetric rf-SQUID into a TWPA, it must be coupled to a capacitor C shunted to ground to form a unit cell, which is repeated to form a transmission line. The SQUID inductance is given by $L_{sym} \approx L/[2(1+\beta_L \cos(\phi_+)\cos(\phi_-))]$. This also means that the effective characteristic impedance of the TWPA, $Z_0=(L_{sym}/C)^{0.5}$ is somewhat dependent on these phase parameters. A TWPA that is designed to match 50 ohms for one set of parameters may be slightly mismatched for other parameters.

Figure 6:
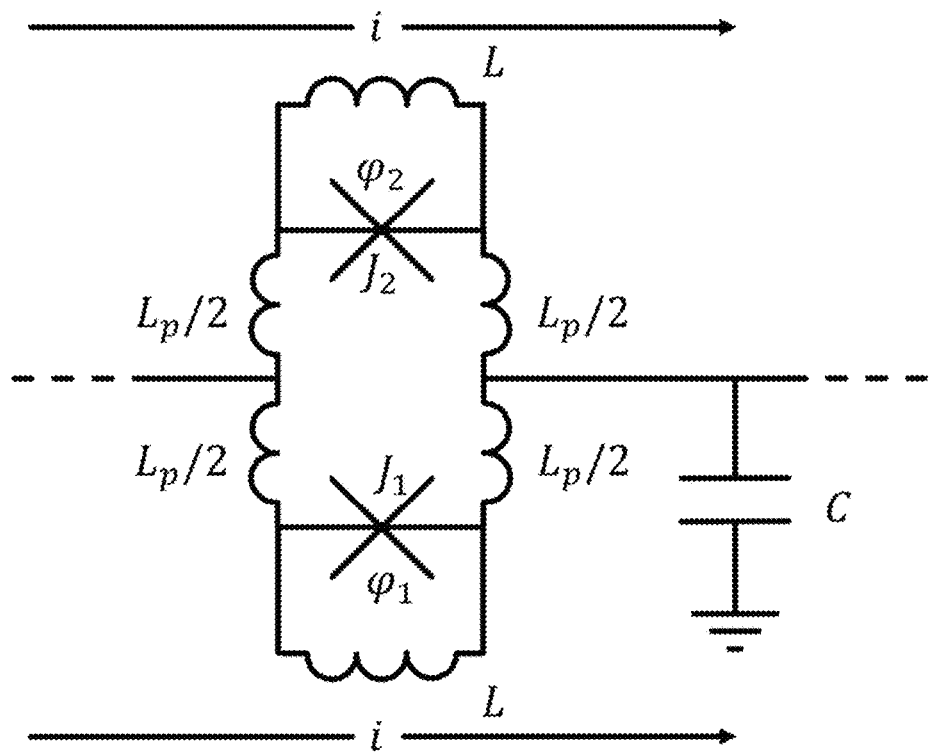
FIG. 6 shows the circuit diagram of a symmetric TWPA, or STWPA.

It is also necessary to cut the small coupling inductance $L_p$ in half to attach the cells together, in order to maintain the symmetry to the device, as shown in FIG. 6. A capacitor may be attached for every SQUID to form a single cell. Alternatively, it may be more convenient to fabricate a double value of C attached to every second cell, for example. That should be functionally equivalent, provided that the effective wavelength at the given signal frequency on the transmission line is much longer than the cell size.

All of the symmetric rf-SQUIDs in a given STWPA are typically essentially identical, and all are flux-biased by the same control currents $I_1$ and $I_2$ along the entire length of the lines. The measurements indicate that the devices as fabricated were in fact sufficiently similar along the full length. The flux bias was tested as a low-frequency, nominally dc control, but it is believed that switching of this flux bias up to at least MHz frequencies should be feasible; and the SQUID itself should be responsive up to much higher frequencies.

Figure 7:
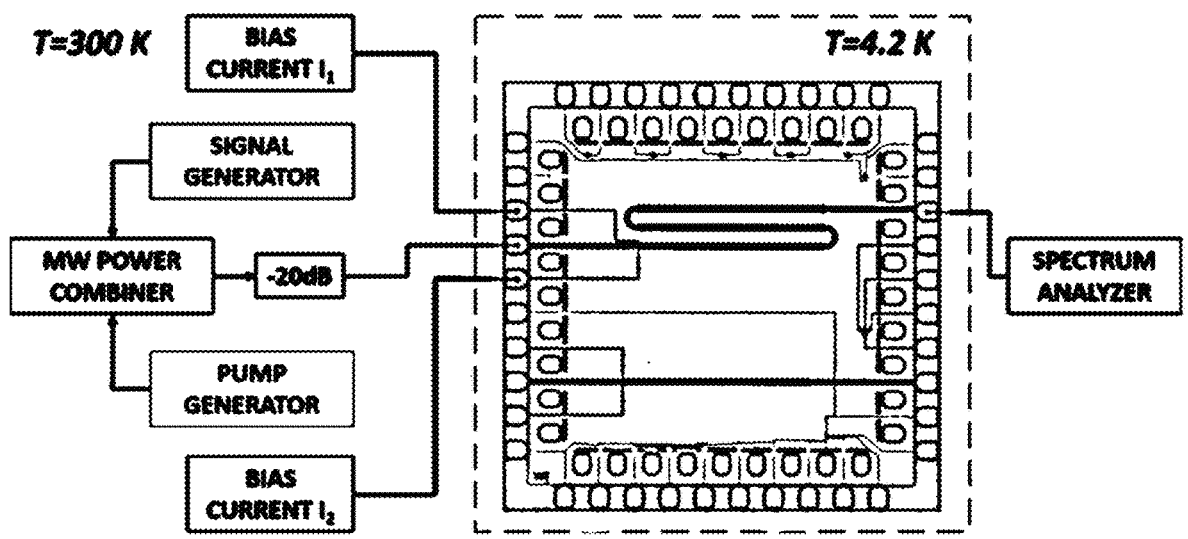
FIG. 7 show a sample STWPA chip and the experimental setup for gain measurements.

The total number of cells is not arbitrary. Since this is a distributed amplifier, additional cells will tend to increase the gain, at least until the pump starts to be depleted. After this point, however, further cells can actually lead to power reduction due to harmonic generation at the signal frequency. Simulations and measurements have confirmed that of order 100-200 cells can provide useful gain, and can also fit on a 5-mm chip, with some meandering as shown in the chip photograph in FIG. 7.

In the samples fabricated, the capacitor was based on two layers of superconducting niobium separated by a thin insulating layer of silicon dioxide ($SiO_2$), with dielectric constant of $\varepsilon_r=3.9$. For example, if the $SiO_2$ layer is d=100 nm thick, the specific capacitance would be C=& $\varepsilon_r\varepsilon_0$/d=0.35 pF/$\mu m^2$. So, if $L_{sym}$=5 pH and C=2 fF (corresponding to an area of 6 $\mu m^2$), this would correspond to $Z_0$=$(L_{sym}/C)^{0.5}$=50 ohms. A key advantage of using a superconductor for both L and C is that resistive loss is extremely small, corresponding to negligible attenuation due to loss.

Regarding the measurements of amplifier gain using the spectrum analyzer, the gain in the signal channel was defined as $G_s=P_{on}/P_{off}$, where $P_{off}$ and $P_{on}$ were the signal power (in dBm units) at the output port (connected to the spectrum analyzer) with the amplifier turned off (bias currents and pump off) and with the amplifier on (bias currents and pump on). The OFF-state values could have been affected by some frequency-dependent mismatch, because the STWPA was designed to match an impedance of 50 ohms with the current bias on. However, with the current bias turned off, the inductance and hence the impedance was shifted slightly. The maximum deviation of the OFF-state signal power due to mismatch was then estimated, resulting in a maximum reflection loss of about 2 dB.

Figure 8:
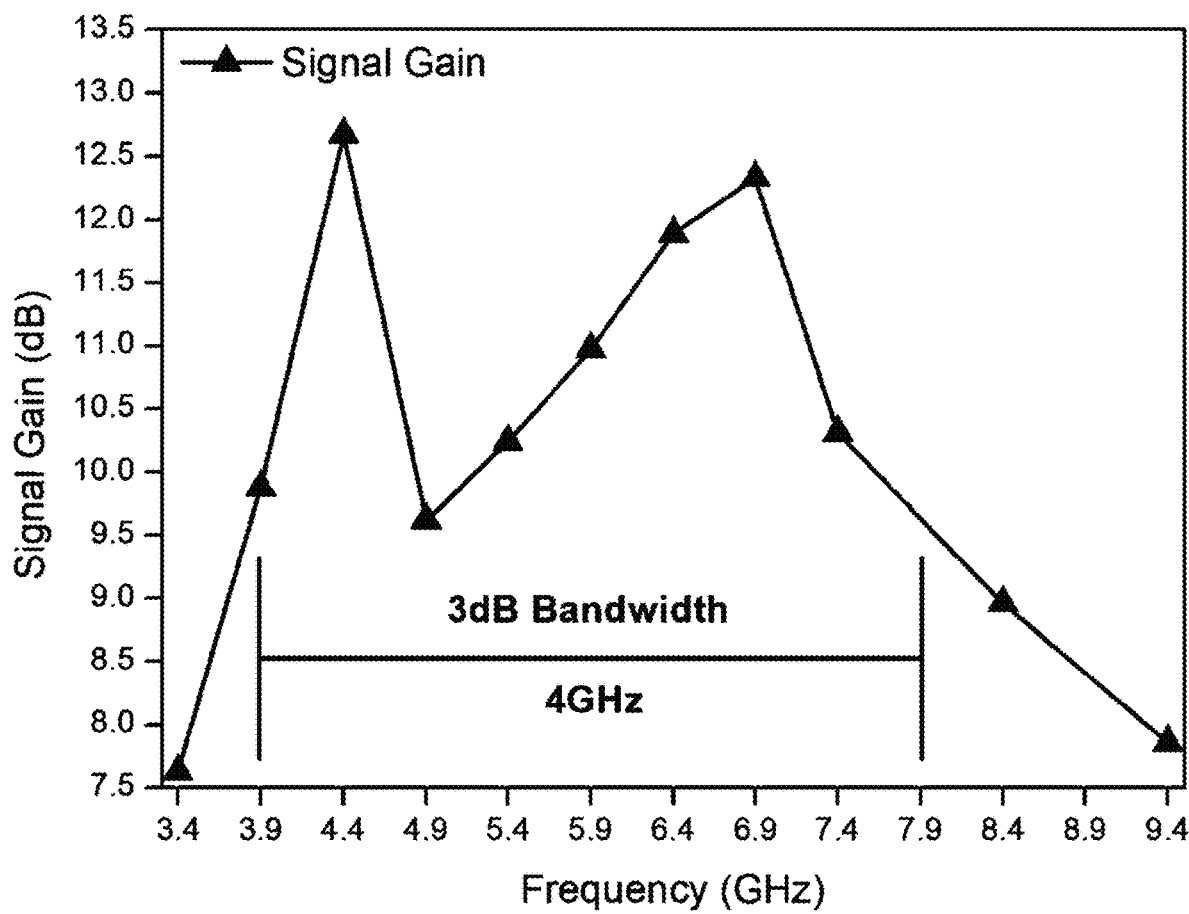
FIG. 8 shows the measured gain of the STWPA as a function of frequency.

FIG. 8 shows the gain for a particular STWPA as a function of input frequency, for a fixed pump frequency of 10.2 GHz, a fixed pump power of −65 dBm, and a fixed set of control currents. This demonstrated a gain >9.5 dB in a 4 GHz bandwidth centered at 5.9 GHZ, with a nominal peak value of 12.5 dB. Moreover, by varying the pump power around this value, higher gain was achieved for some signal frequencies, such as a 17 dB gain at 7.9 GHZ, 11 dB at 8.4 GHz and 9.4 GHz. The dip at 4.9 GHz was unexpected, and may reflect an unintended resonance in the transmission line or in its connections. This might also be responsible for the variation with pump power. However, we believe that this prototype clearly demonstrated the operating principles of the STWPA, even if this leaves room for future improvement.

Figure 9:
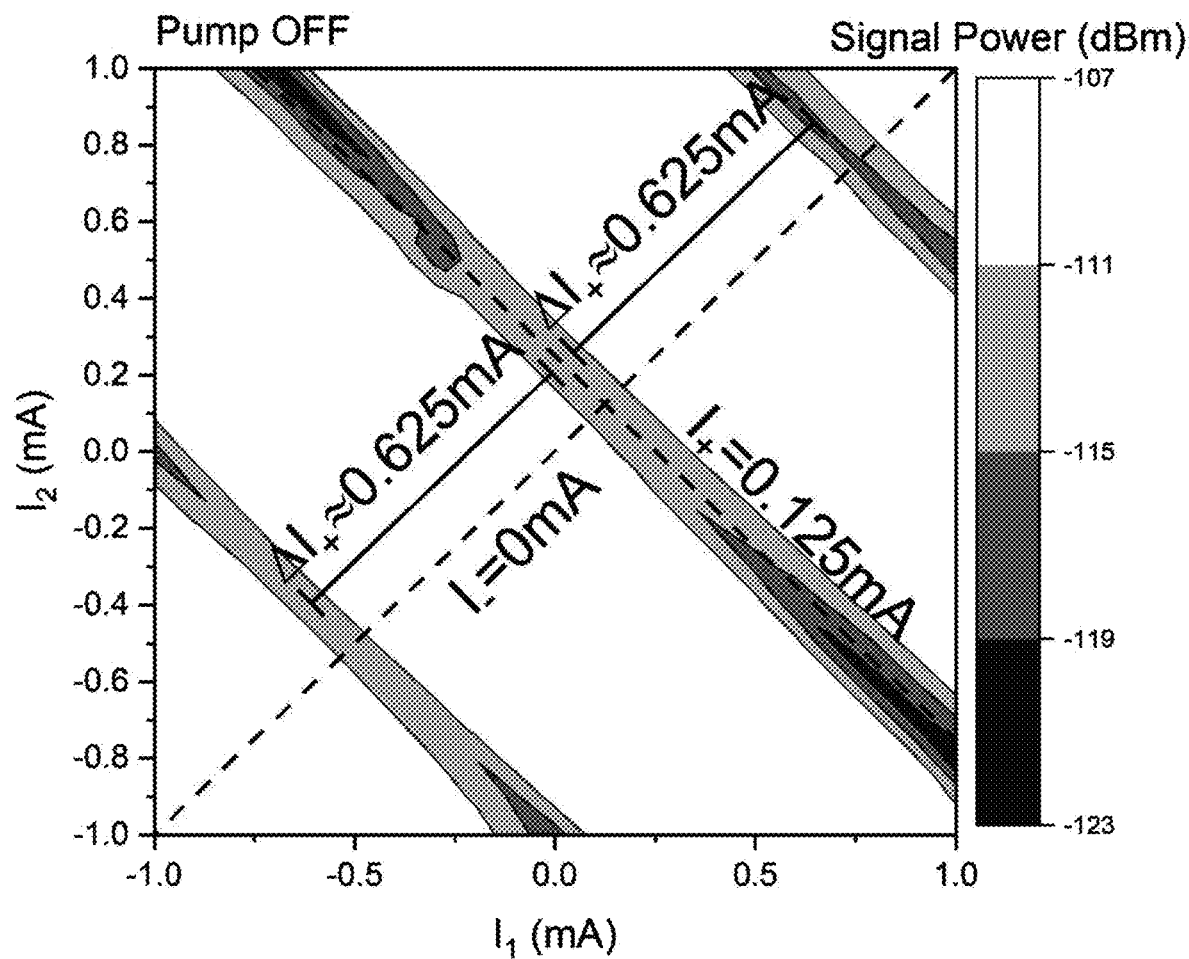
FIG. 9 shows the output power of the STWPA as a function of the two control currents.

FIG. 9 shows the output power for a fixed input frequency of 4.4 GHZ, where the output signal power with the pump OFF is plotted as a function of control currents. This would not be expected to exhibit gain, and in fact shows a strong loss for those same control parameters that correspond to gain with the pump ON. As expected, this loss is symmetric around the $I_1=I_2$ line ($I_-=0$), and also is periodic in $I_+$—the diagonal segments of greatest attenuation are equally spaced by a value of $\Delta I_+$=0.625 mA, starting at $I_+$=0.125 mA. These diagonal segments correspond to a very high second-order effect, which is maximized when $\phi_+=\pi/2$. The attenuation is greatest here because $2^{nd}$ harmonic generation is large here, and indeed, there is a corresponding peak (not shown) at twice the input frequency.

Figure 10A:
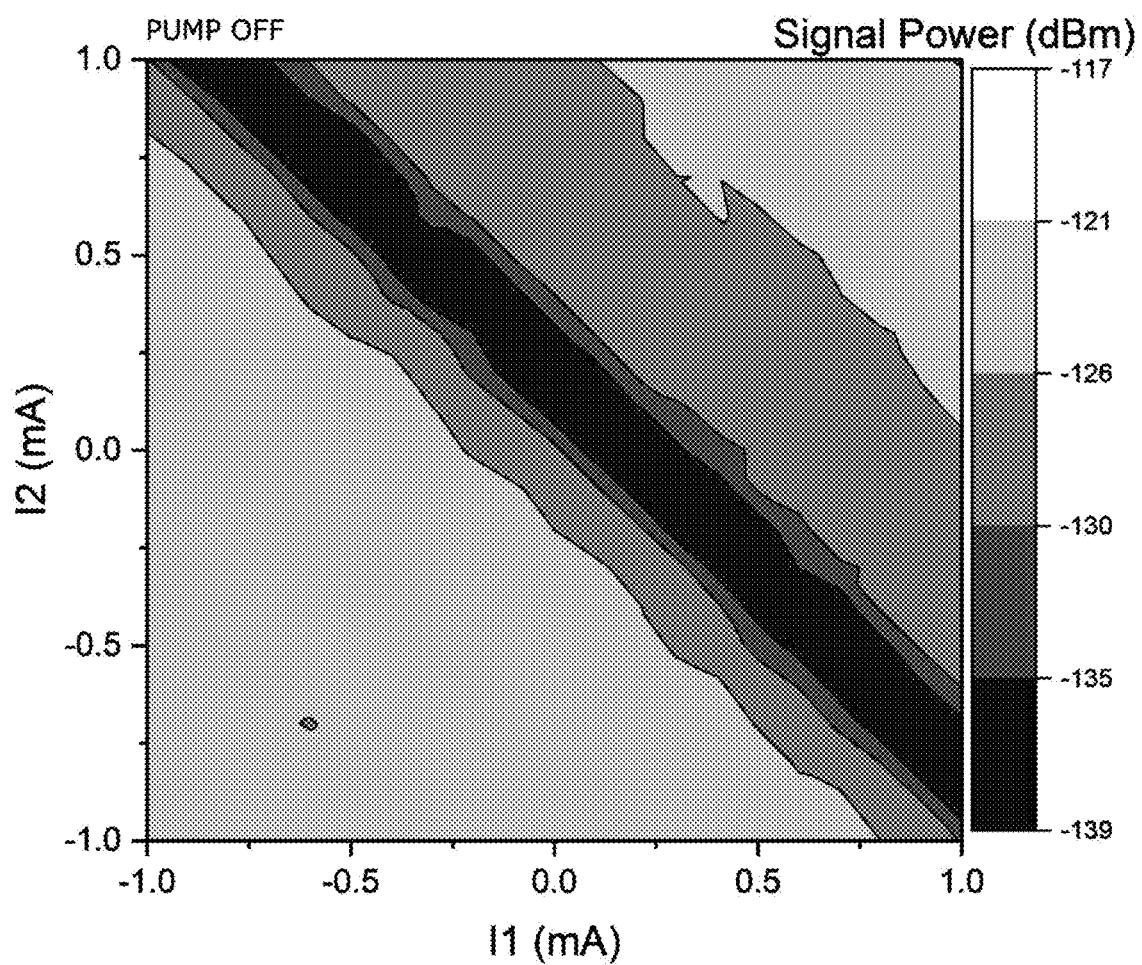
FIG. 10A shows the output power of the STWPA with the pump turned off.
Figure 10B:
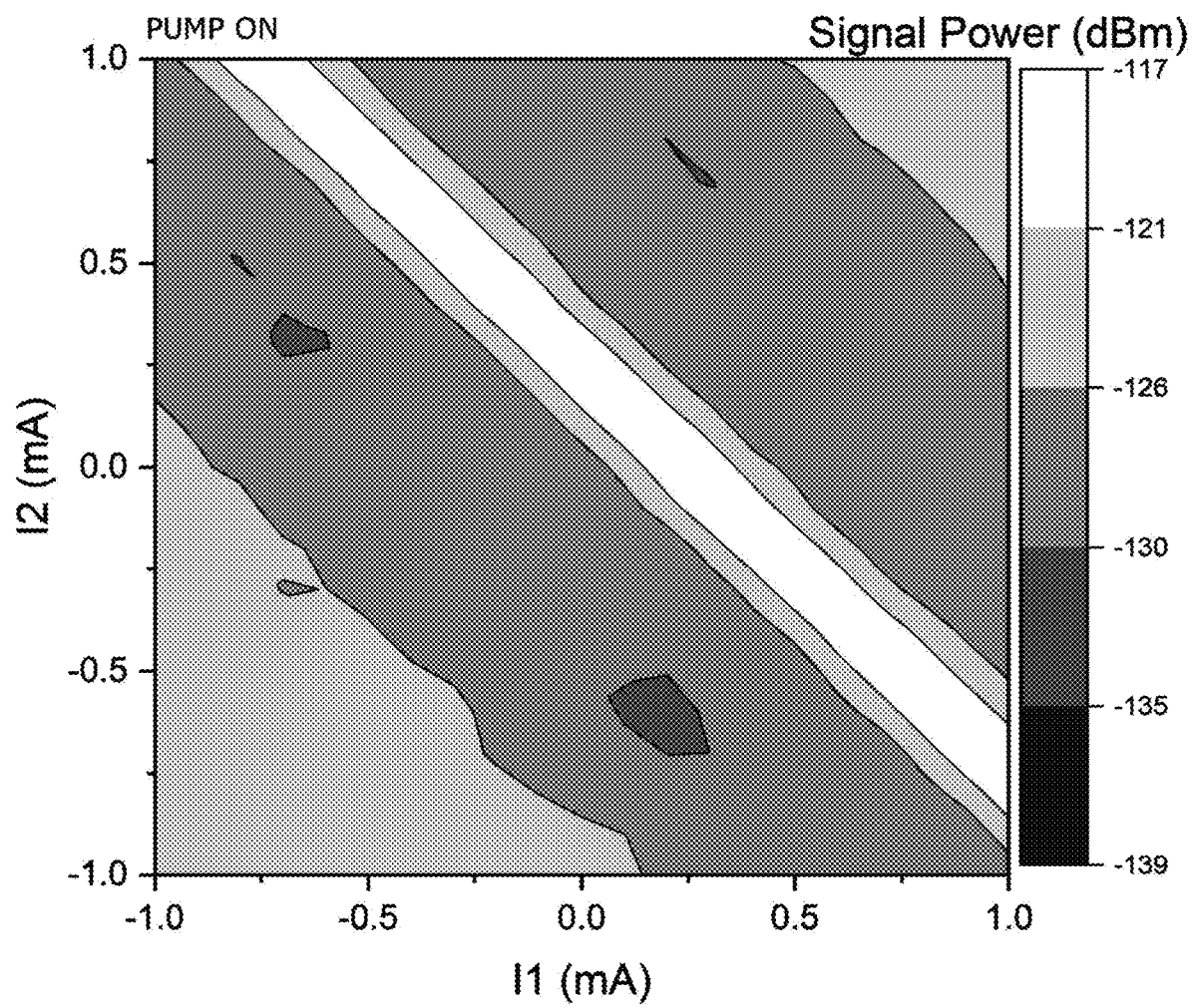

Similar behavior is exhibited for a different STWPA sample in FIGS. 10A and 10B. This compares signal power vs. bias currents with pump off (FIG. 10A) and pump on (FIG. 10B), for a fixed frequency. For FIG. 10A, on the segment corresponding to $\phi_+=\pi/2$, with pump off, the signal is mostly attenuated and converted into its second harmonic component. When $\phi_+=\pi/2$, the second-order effect has maximum efficiency, giving a strong second harmonic generation. With the pump on (FIG. 10B), the segment corresponding to $\phi_+=\pi/2$ is where the signal is most strongly amplified. In fact, in the ON-state, the second-order effect generates a strong second-order parametric conversion process, corresponding to the three-wave mixing regime.

More generally, for the biases corresponding to $\phi_+=\pi/2$, across the entire 4 GHZ bandwidth, the difference in output signal power between pump ON and OFF was at least 20 dB, at pump OFF, the This mechanism could then be used as a broadband, non-resonant Pump Driven On/Off RF-Switch. This could play a useful role in many applications, where very weak signals need to be accurately controlled.

Moreover, we verified the correct second-order operation by checking the idler frequency $f_i=f_p-f_s$ at the output port, in addition to the signal frequency. The idler was relatively high in power, reaching values between −135 dB and −123 dB. Nonlinear mixing is also generated at the sum of the component frequencies. This means that the STWPA could be potentially useful also as a coherent Up-Down converting rf-Mixer for weak signals, allowing the direct implementation of wave mixing at 4K or even at the mK stage of a dilution refrigerator. This STWPA approach could help the transition to fully superconducting control electronics, replacing room-temperature mixers. Together with the amplifier itself, these may make the STWPA a versatile system that could perform a wide range of operations with the same on-chip circuit.

Figure 11:
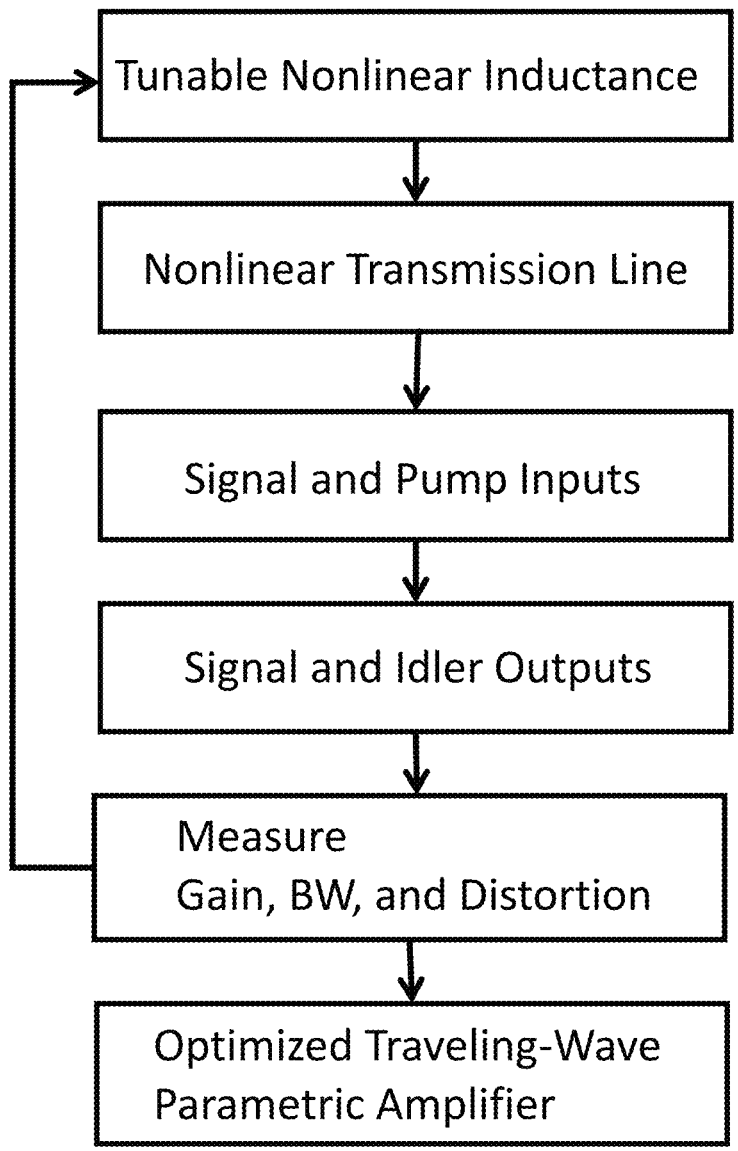
FIG. 11 presents a method for parametric amplification using tunable nonlinear superconducting inductors.

In addition to the specific systems described in this application, FIG. 11 presents a general method for implementing amplifiers based on tunable nonlinear superconducting inductors. The key is the tunability based on two or more controls, which enables independent optimization of multiple performance metrics. By successive iteration of tuning and measurement, one may obtain superior performance in terms of an appropriate combination of gain, bandwidth, efficiency, distortion, and noise.

Other devices, apparatus, systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

What is claimed is:

1. A microwave amplifier system, comprising:
    an input port configured to receive a microwave signal;
    a plurality of microwave amplifiers in series being connected to receive the microwave signal, each microwave amplifier comprising at least one active element, a shunt capacitor, and a serial inductor, having an inductance which is a nonlinear function of a total signal in the serial inductor;
    a control port, configured to receive a signal which modulates the total signal in at least one serial inductor; and
    an output port, configured to present an amplified representation of the received microwave signal from the plurality of microwave amplifiers in series,
    wherein each microwave amplifier comprises a pair of shunted Josephson junctions forming a central loop, and an independent inductive loop for each Josephson junction, each independent inductive loop being inductively coupled to a control line, an input to the microwave amplifier being formed in the central loop between the pair of shunted Josephson junctions on a first side, and an output from the microwave amplifier being formed in the central loop between the pair of shunted Josephson junctions on a second side, having a shunt capacitor on the second side.

2. The microwave amplifier system according to claim 1, wherein the microwave amplifier has a characteristic impedance of 50 Ohms.

3. The microwave amplifier system according to claim 1, wherein microwave amplifier comprises a symmetric rf-SQUID.

4. The microwave amplifier system according to claim 1, wherein the microwave amplifier has a nominal effective inductance of L~10 pH and a capacitance of C~4 fF.

5. The microwave amplifier system according to claim 1, wherein the control port is configured to receive at least two signals, which each control a different nonlinearity order of a respective microwave amplifier.

6. The microwave amplifier according to claim 1, wherein the plurality of microwave amplifiers comprise at least 100 microwave amplifiers.

7. The microwave amplifier according to claim 1, having a power gain of at least 12 dB.

8. The microwave amplifier according to claim 1, wherein the plurality of microwave amplifier stages produce a frequency-shifted replica of the microwave input signal at a frequency $2f_p - f_s$, where $f_p$ is a frequency of a pump signal received at the control port outside a bandwidth of the microwave signal, and $f_s$ is a component of the microwave signal.

9. A method of amplifying a microwave signal, comprising:
receiving a microwave signal;
receiving a control input;
processing the microwave signal with a plurality of microwave amplifiers in series, each microwave amplifier comprising a tunable microwave stage, comprising:
a signal input configured to receive the microwave signal;
an amplifier comprising a radio frequency superconducting quantum interference device (rf-SQUID) comprising a pair of shunted Josephson junctions, each Josephson junction having an associated inductive loop, wherein an effective inductance of the inductive loop is dependent on a total signal in the inductive loop dependent on an input to the rf-SQUID and the control signal inductively coupled to the inductive loop;
a shunt capacitor at an output of the rf-SQUID; and
an output configured to present an amplified representation of the microwave signal from the tunable microwave stage;
modulating the total signal in at least one inductive loop with the received control signal; and
outputting an amplified representation of the received microwave signal from the plurality of tunable microwave stages in series.

10. The method according to claim 9, wherein the control signal is a modulated signal having a bandwidth outside a bandwidth of the microwave signal.

11. The method according to claim 9, further comprising:
analyzing a distortion of the plurality of microwave amplifiers in series; and
tuning nonlinearities of the plurality of microwave amplifiers in series using the control signal, dependent on at least the analyzed distortion.

12. A tunable microwave device, comprising:
a signal input configured to receive a microwave signal;
a control input;
an amplifier comprising a radio frequency superconducting quantum interference device (rf-SQUID) comprising a pair of shunted Josephson junctions, each Josephson junction having an associated inductive loop, wherein an effective inductance of the inductive loop is dependent on a total signal in the inductive loop dependent on an input to the rf-SQUID and the control signal inductively coupled to the inductive loop;
a shunt capacitor at an output of the rf-SQUID; and
an output configured to present an amplified representation of the microwave signal.

13. The tunable microwave device according to claim 12, wherein the amplifier has at least two control inputs, which each control a different nonlinearity order of the amplifier.

14. The tunable microwave device according to claim 12, wherein the rf-SQUID comprises a symmetric rf-SQUID.

15. The tunable microwave device according to claim 12, wherein the rf-SQUID is shunted with a parasitic inductance $L_p$, and each associated inductive loop is coupled to a current in a respective control line.

16. The tunable microwave device according to claim 15, wherein the respective control line associated with each associated inductive loop is coupled through a mutual inductance M to the magnetic flux Φ of each associated inductive loop.

17. The tunable microwave device according to claim 16, wherein the mutual inductance M of each associated inductive loop is negligibly coupled to a loop formed between the pair of shunted Josephson junctions.

18. The tunable microwave device according to claim 12, further comprising a second tunable microwave device, comprising:
a second signal input configured to receive the output;
a second control input;
a second amplifier comprising a radio second frequency superconducting quantum interference device (rf-SQUID) comprising a second pair of shunted Josephson junctions;
a second shunt capacitor at an output of the rf-SQUID; and
a second output,
the signal input being formed in a central loop between the pair of shunted Josephson junctions on a first side, and an output being formed in the central loop between the pair of shunted Josephson junctions on a second side, having the shunt capacitor on the second side.

19. The tunable microwave device according to claim 12, wherein the control input is configured to receive at least two signals, each of which control a respectively different nonlinearity order of the tunable microwave device.

* * * * *